(12) United States Patent
Kasai

(10) Patent No.: US 11,762,011 B2
(45) Date of Patent: Sep. 19, 2023

(54) TEMPERATURE ADJUSTMENT METHOD FOR MOUNTING BASE, INSPECTION DEVICE, AND MOUNTING BASE

(71) Applicant: TOKYO ELECTRON LIMITED, Tokyo (JP)

(72) Inventor: Shigeru Kasai, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 17/611,879

(22) PCT Filed: May 8, 2020

(86) PCT No.: PCT/JP2020/018658
§ 371 (c)(1),
(2) Date: Nov. 16, 2021

(87) PCT Pub. No.: WO2020/235356
PCT Pub. Date: Nov. 26, 2020

(65) Prior Publication Data
US 2022/0221509 A1    Jul. 14, 2022

(30) Foreign Application Priority Data
May 20, 2019  (JP) ................ 2019-094668

(51) Int. Cl.
*G01R 31/28* (2006.01)
(52) U.S. Cl.
CPC ..... *G01R 31/2874* (2013.01); *G01R 31/2875* (2013.01); *G01R 31/2877* (2013.01)
(58) Field of Classification Search
CPC ............. G01R 31/2884; G01R 1/0458; G01R 31/2877; G01R 31/2874; G01R 31/2831
See application file for complete search history.

(56) References Cited

U.S. PATENT DOCUMENTS 6,744,018 B2    6/2004  Takano
6,774,661 B1 *  8/2004  Tustaniwskyj ....... G01R 31/287
                                                   324/750.09
(Continued)

FOREIGN PATENT DOCUMENTS

JP    2002-184558 A    6/2002
JP    2002-231421 A    8/2002
(Continued)

OTHER PUBLICATIONS

PCT International Search Report, PCT Application No. PCT/JP2020/018658, dated Jul. 21, 2020, 9 pages (with English translation of International Search Report).

*Primary Examiner* — Tung X Nguyen
(74) *Attorney, Agent, or Firm* — Fenwick & West LLP

(57) ABSTRACT

A method for performing temperature control of a mounting base on which a substrate is to be mounted. A substrate mounting surface of the mounting base is divided in the radial direction into a plurality of regions, and a heater is provided to each of the plurality of regions. The method includes: a step for performing feedback control that adjusts the operation amount of the heater in the centermost region of the plurality of regions of the substrate mounting surface such that the centermost region is at a set temperature; and a step for performing feedback control that adjusts the operation amount of the heater in an outside region that is further to the outside than the centermost region of the plurality of regions of the substrate mounting surface such that the temperature difference between the outside region and the region that is adjacent to the outside region on the inside in the radial direction is a preset value.

6 Claims, 6 Drawing Sheets

(56) References Cited

U.S. PATENT DOCUMENTS

| | | |
|---|---|---|
| 10,566,218 B2 | 2/2020 | Unno et al. |
| 2003/0183613 A1 | 10/2003 | Takano |
| 2017/0372928 A1 | 12/2017 | Yamada et al. |
| 2018/0204748 A1 | 7/2018 | Unno et al. |
| 2019/0025342 A1* | 1/2019 | Mori .................. G01R 31/2891 |
| 2022/0013387 A1 | 1/2022 | Yamada et al. |

FOREIGN PATENT DOCUMENTS

| | | |
|---|---|---|
| JP | 2003-282461 A | 10/2003 |
| JP | 2017-228230 A | 12/2017 |
| KR | 10-2003-0077925 A | 10/2003 |
| KR | 10-2018-0001475 A | 1/2018 |
| KR | 10-2018-0059761 A | 6/2018 |
| WO | WO 2018/030433 A1 | 2/2018 |

* cited by examiner

TEMPERATURE ADJUSTMENT METHOD FOR MOUNTING BASE, INSPECTION DEVICE, AND MOUNTING BASE

TECHNICAL FIELD

The present disclosure is related to a temperature adjustment method for a mounting base, a test device, and a mounting base.

BACKGROUND

Patent Document 1 discloses a heater for a test device. The entirety of a substrate constituting this heater has a disk shape by combining a central segment of the disk shape and a plurality of wide arc-shaped segments provided so as to surround an outer periphery of the central segment. Further, Patent Document 1 discloses that, when a temperature measuring element is attached to each segment of the substrate to control the temperature on each segment, a non-uniform temperature distribution over the entire substrate is much less likely to occur.

Patent Document 1: Japanese Patent Application Publication No. 2002-184558

SUMMARY

A technology related to the present disclosure is that, when a substrate mounting surface of a mounting base is divided into a plurality of regions in a diametral direction and a heater is provided in each region to control a temperature of the substrate mounting surface, even in a transitional period, it is possible to control an amount of deviation from a set value of the temperature of each region to be within a desired range.

According to an aspect of the present disclosure, there is provided a method of performing temperature control of a mounting base on which a substrate is to be mounted, the method including dividing a substrate mounting surface of the mounting base into a plurality of regions in a diametral direction and providing a heater with respect to each of the plurality of regions, performing feedback control that adjusts an operation amount of the heater in a centermost region among the plurality of regions of the substrate mounting surface so that a temperature of the centermost region reaches a set temperature, and performing feedback control that adjusts the operation amount of the heater in an outer side region outside the centermost region among the plurality of regions of the substrate mounting surface so that a temperature difference between the outer side region and the region that is adjacent to the outer side region inward in the diametral direction becomes a preset value.

Effect of the Invention

According to the present disclosure, when a substrate mounting surface of a mounting base is divided into a plurality of regions in a diametral direction and a heater is provided in each region to control a temperature of the substrate mounting surface, even in a transitional period, it is possible to control an amount of deviation from a set value of the temperature of each region to be within a desired range.

DETAILED DESCRIPTION

Figure 1:
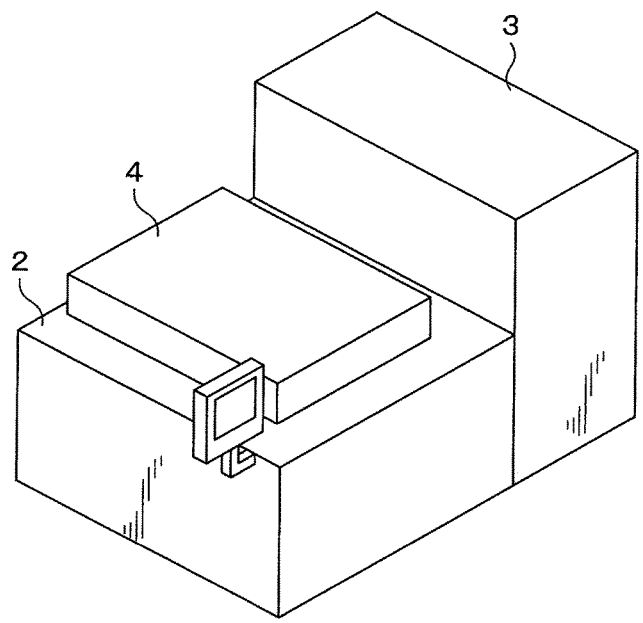
FIG. 1 is a perspective view illustrating an outline of a configuration of a test device according to the present embodiment.

In a semiconductor manufacturing process, a large number of electronic devices having a predetermined circuit pattern are formed on a semiconductor wafer (hereinafter, referred to as a "wafer"). The formed electronic devices are tested for electrical characteristics or the like and are classified into non-defective parts and defective parts. The electronic devices included in the wafer is examined using a test device, for example, while maintaining their position in the wafer, before each electronic device is divided.

In addition, in recent years, in some test devices, a heater or a cooling mechanism is provided in a mounting base on which the wafer is mounted so that the electrical characteristics of the electronic device can be tested at a high or low temperature.

When a heater is provided in the mounting base, a substrate mounting surface of the mounting base may be divided into two regions in a diametral direction, that is, a central region and a peripheral region surrounding an outer periphery of the central region, and the heater may be provided in each of the central region and the peripheral region. In this case, in order to make the temperature of the substrate mounting surface uniform in the surface, the temperature of each region of the substrate mounting surface may be measured, and feedback calculation (Proportional Integral Differential (PID) calculation or the like) may be performed to adjust an operation amount of the heat provided in each region, that is, to individually feedback-control the temperature of each region so that the temperature of each region becomes a set temperature. Hereinafter, this control is referred to as a conventional individualized feedback control.

According to the above conventional individualized feedback control, good results can be obtained in a steady state where the temperature of each region is stable. However, in the above-described conventional individualized feedback control, in a transitional period (for example, a time when an electrical characteristic test is started and an electronic device starts to generate heat or the like), an amount of deviation from the set temperature may not be within a desired range only in the central region. The reason will be described below.

Even when the substrate mounting surface is divided in the diametral direction into three or more regions instead of two regions as described above and each region is controlled in the same manner as the above-described conventional individualized feedback control, there is a problem similar to the above-described one. Specifically, the closer the region is to the centermost, the more likely it is that the amount of deviation from the set temperature will not fall within the desired range during the transitional period.

Therefore, according to a technology related to the present disclosure, when the substrate mounting surface of the mounting base is divided into a plurality of regions in the diametral direction and provides the heater for each region to control the temperature of the substrate mounting surface, even in the transitional period, it is possible to control an amount of deviation from the set value of the temperature of each region to be within a desired range.

Hereinafter, a temperature adjustment method for a mounting base, a test device, and a mounting base according to the present embodiment will be described with reference to the accompanying drawings. In the present specification and the drawings, elements having substantially the same functional configuration are designated with the same reference numerals, and thus, repeated descriptions will be omitted.

Figure 2:
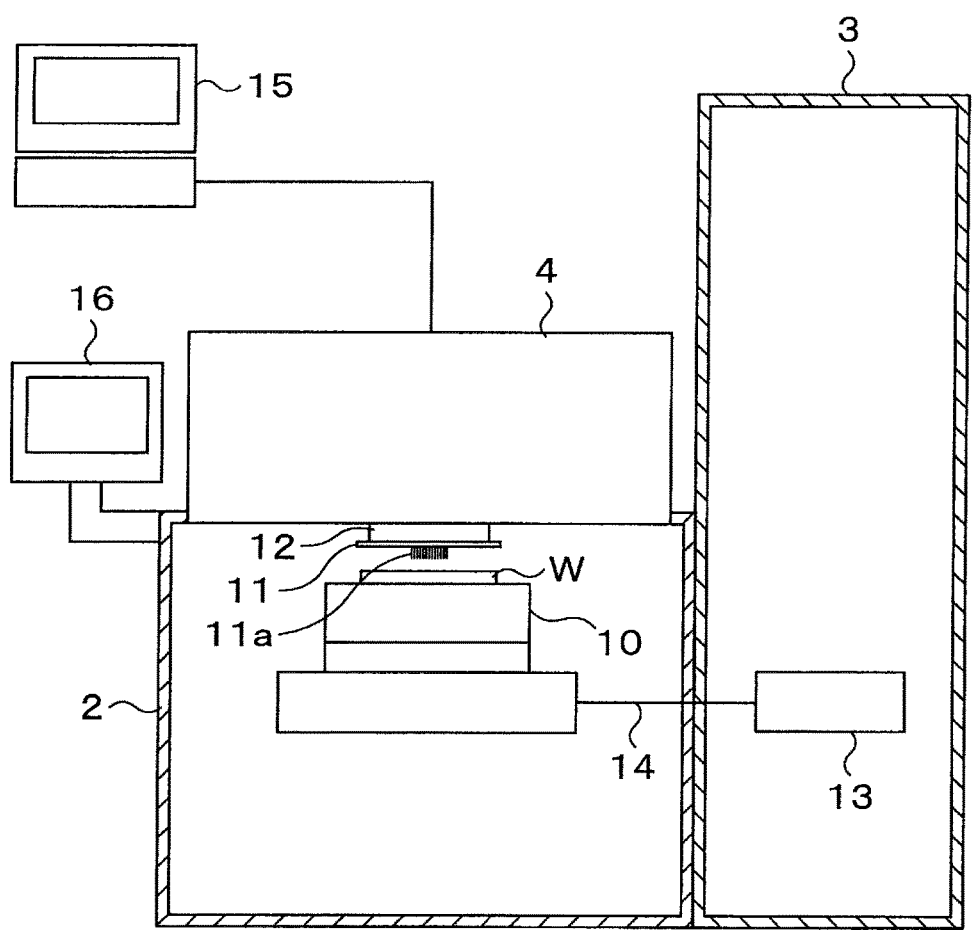
FIG. 2 is a front view illustrating the outline of the configuration of the test device according to the present embodiment.

First, a configuration of a test device according to the present embodiment will be described. FIGS. 1 and 2 are a perspective view and a front view illustrating an outline of a configuration of a test device 1 according to the present embodiment. In FIG. 2, a portion of the test device 1 of FIG. 1 is illustrated in cross section in order to illustrate components contained in an accommodation chamber and a loader described below.

The test device 1 performs an electrical characteristic test on each of a plurality of electronic devices (not illustrated) formed on a wafer W as the substrate to be tested. As illustrated in FIGS. 1 and 2, the test device 1 includes an accommodation chamber 2 which accommodates the wafer W at the time of test, a loader 3 disposed adjacent to the accommodation chamber 2, and a tester 4 disposed to cover an upper portion of the accommodation chamber.

As illustrated in FIG. 2, the accommodation chamber 2 has a hollow housing and has a stage 10 as a mounting base on which the wafer W is mounted. The stage 10 adsorbs and holds the wafer W so that a position of the wafer W with respect to the stage 10 does not shift. Further, the stage 10 is movable in a horizontal direction and a vertical direction, and according to this configuration, a relative position of a probe card 11 described below and the wafer W is adjusted so that electrodes on a surface of the wafer W can be brought into contact with probes of the probe card 11.

The probe card 11 is disposed above the stage 10 so as to face the stage 10 in the accommodation chamber 2. The probe card 11 has probes 11a which come into electrical contact with the electrodes or the like of the electronic device provided on the wafer W.

Further, the probe card 11 is connected to the tester 4 via an interface 12. Each probe 11a comes into contact with one of the electrodes of each electronic device of the wafer W during the electrical characteristic test, supplies power from the tester 4 to the electronic device via the interface 12, and transmits a signal from the electronic device to the tester 4 via the interface 12.

The loader 3 takes out the wafer W accommodated in a front opening unified pod (FOUP) (not illustrated), which is a transport container, and transports the wafer W to the stage 10 of the accommodation chamber 2. Further, the loader 3 receives the wafer W, on which the electrical characteristic test of the electronic device is completely performed, from the stage 10 and accommodates the wafer W in the FOUP.

Further, the loader 3 has a control unit 13 which performs various controls such as temperature control of the stage 10. The control unit 13, which is also referred to as a base unit, includes, for example, a computer equipped with a central processing unit (CPU), a memory, or the like and has a program storage unit (not illustrated). The program storage unit stores programs that control various processes in the test device 1. The program may be recorded on a computer-readable storage medium and may be installed in the control unit 13 from the storage medium. Some or all of the programs may be realized as dedicated hardware (circuit substrate). The control unit 13 is connected to the stage 10 via a wire 14, for example, and controls a heating unit 120 described below based on a temperature of a top plate 110 described below in the stage 10. The control unit 13 may be provided in the accommodation chamber 2.

The tester 4 has a test board (not illustrated) that reproduces a portion of a circuit configuration of a motherboard on which the electronic device is mounted. The test board is connected to a tester computer 15 that determines the quality of the electronic device based on the signal from the electronic device. In the tester 4, circuit configurations of a plurality of types of motherboards can be reproduced by replacing the test board.

Further, the test device 1 includes a user interface unit 16 for displaying information dedicated for a user and inputting an instruction by the user. The user interface unit 16 includes, for example, an input unit, such as a touch panel or a keyboard, and a display unit such as a liquid crystal display.

In the test device 1 having each of the above-described components, the tester computer 15 transmits data to the test board connected to the electronic device via each probe 11a when performing the electrical characteristic test on the electronic device. Then, the tester computer 15 determines whether or not the transmitted data has been correctly processed by the test board based on an electric signal from the test board.

Figure 3:
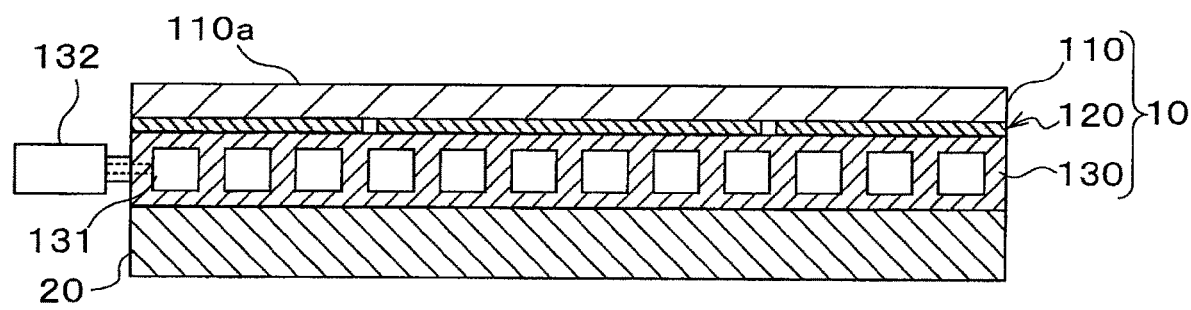
FIG. 3 is a cross-sectional view schematically illustrating a configuration of a stage.
Figure 4:
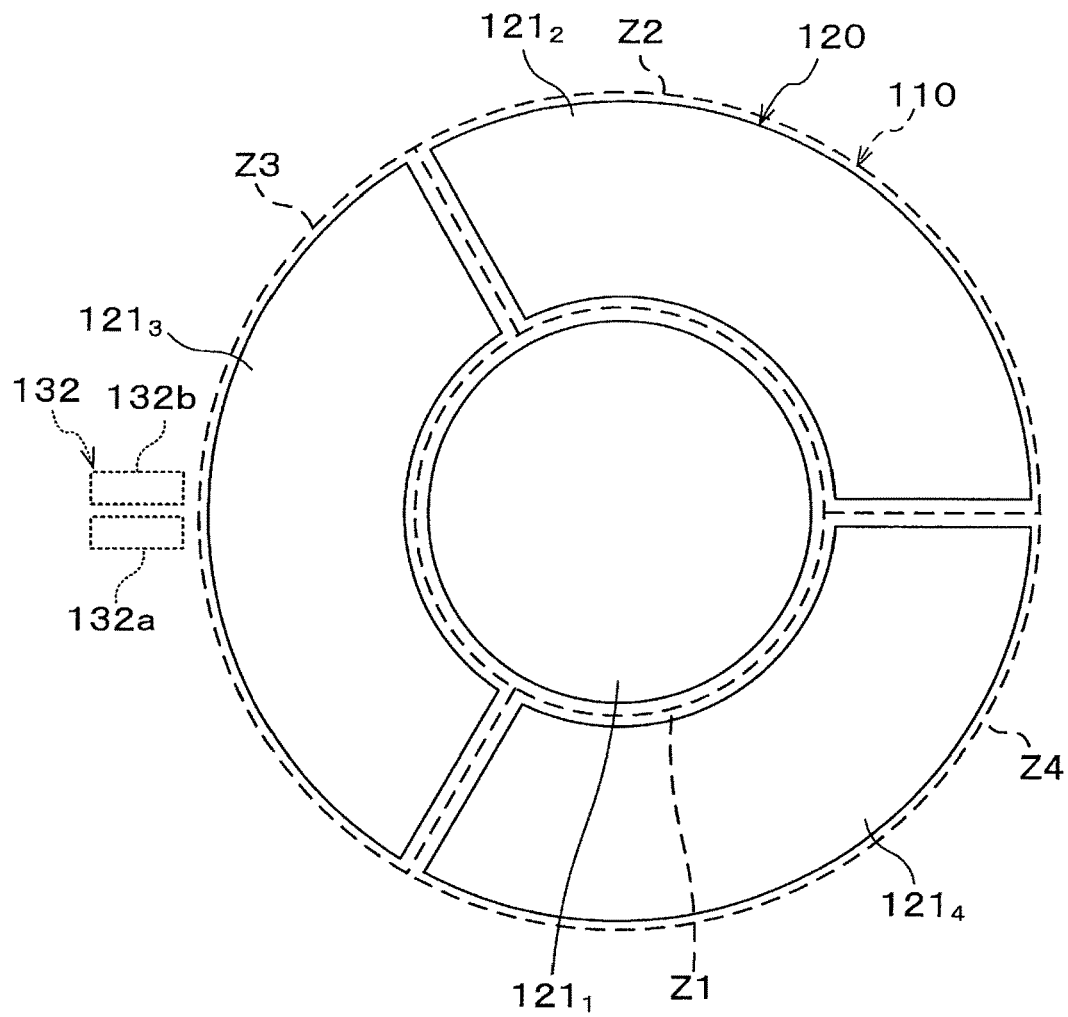
FIG. 4 is a plan view schematically illustrating the configuration of a heating unit.

Next, a configuration of the stage 10 will be described with reference to FIGS. 3 and 4. FIG. 3 is a cross-sectional view schematically illustrating the configuration of the stage 10. FIG. 4 is a plan view schematically illustrating the configuration of the heating unit 120 described below.

As illustrated in FIG. 3, the stage 10 is formed by stacking a plurality of functional units including the heating unit 120. The stage 10 is mounted on a moving mechanism (not illustrated), which moves the stage 10 in the horizontal direction and the vertical direction, via a heat insulating portion 20. The heat insulating portion 20 is made of, for example, a resin, graphite, ceramic having low thermal conductivity, or the like.

The stage 10 has, in the order from the top, a top plate 110, the heating unit 120, and a cooling unit 130.

The top plate 110 is a member of which an upper surface 110a serves as a wafer mounting surface which is the substrate mounting surface on which the wafer W is mounted. Hereinafter, the upper surface 110a of the top plate 110, which is also the upper surface of the stage 10, may be referred to as the wafer mounting surface 110a. The top plate 110 is formed in a disk shape, for example. Further, the top plate 110 is formed thinly so as to have a small heat capacity by using a material having high thermal conductivity and Young's modulus. By reducing heat capacity of the top plate 110, for example, the temperature of the top plate 110 can be changed at high speed by heating the heating unit 120. As the material of the top plate 110, for example, ceramics such as SiC and AlN are used, and when it is necessary to further reduce a production cost, metals such as copper and aluminum are used.

The heating unit 120 is a member that heats the top plate 110. The heating unit 120 is provided between the top plate 110 and the cooling unit 130, in other words, is provided at a position closer to the wafer mounting surface 110a than the cooling unit 130. The heating unit 120 has a built-in resistance heating element that generates heat by feeding power. In the present embodiment, the resistance heating element is formed of a material (for example, tungsten) of which an electrical resistance changes depending on the temperature. Although not illustrated, an electromagnetic shield layer is provided between the heating unit 120 and the top plate 110, which is made of a highly conductive material such as an insulating layer formed of an insulating material such as mica or polyimide or a metal material.

Further, as illustrated in FIG. 4, the wafer mounting surface 110a of the top plate 110 to be heated by the heating unit 120 is divided into two regions in the diametral direction. Specifically, in a plan view, the top plate 110 is divided into a circular first region Z1 located at the center and an annular region surrounding the first region Z1, and in the present embodiment, the annular region is divided into three equal parts, that is, second to fourth regions Z2 to Z4.

Moreover, the heating unit 120 has heaters $121_1$ to $121_4$ respectively provided in the first to fourth regions Z1 to Z4 of the top plate 110. Each of the heaters $121_1$ to $121_4$ has the built-in resistance heating element described above and is configured to be individually controllable.

The heater $121_1$ is formed in a circular shape in a plan view according to the shape of the corresponding first region Z1 of the wafer mounting surface 110a, and the heaters $121_2$ to $121_4$ are formed in a circular arc shape in a plan view according to the shapes of the corresponding second to fourth regions Z2 to Z4 of the wafer mounting surface 110a.

Return to the descriptions of FIG. 3.

The cooling unit 130 is a member that cools the top plate 110 and is formed in a disk shape, for example. A flow path 131 through which a refrigerant flows is formed inside the cooling unit 130. A port 132 is connected to a side portion of the cooling unit 130. As illustrated in FIG. 4, the port 132 has a supply port 132a through which the refrigerant is supplied to the flow path 131 and a discharge port 132b through which the refrigerant is discharged from the flow path 131.

As the refrigerant, for example, a fluorine-based liquid, a liquid such as ethylene glycol, or a gas such as nitrogen can be used.

Although not illustrated, the electromagnetic shield layer formed of a material having high conductivity such as a metal material is provided between the cooling unit 130 and the heating unit 120.

The heating unit 120 and the cooling unit 130 configured as described above are controlled by the control unit 13.

Figure 5:
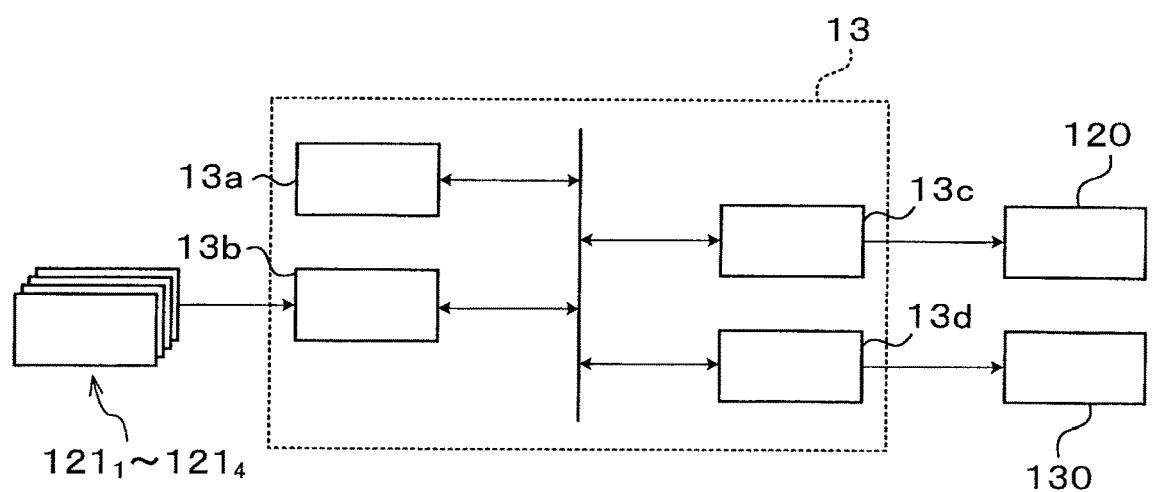
FIG. 5 is a block diagram schematically illustrating an outline of a configuration of a control unit.
Figure 6:
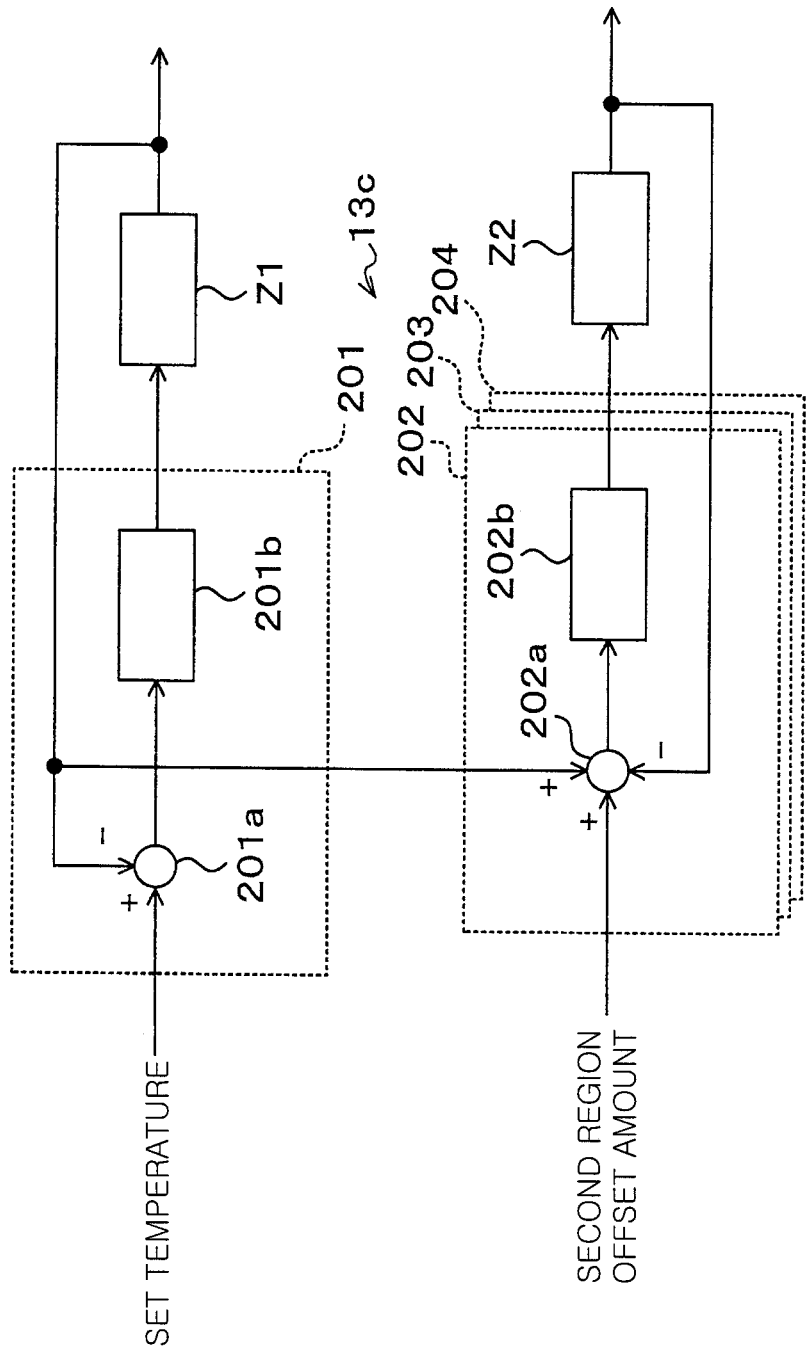
FIG. 6 is a block diagram schematically illustrating an outline of a configuration of a heating control unit.

Subsequently, a configuration of the control unit 13 for controlling the heating unit 120 and the cooling unit 130 will be described with reference to FIGS. 5 and 6. FIG. 5 is a block diagram schematically illustrating an outline of a configuration of the control unit 13, and FIG. 6 is a block diagram schematically illustrating an outline of a configuration of a heating control unit described below.

As illustrated in FIG. 5, the control unit 13 includes a storage unit 13a, a temperature acquisition unit 13b, a heating control unit 13c, and a cooling control unit 13d.

The storage unit 13a stores various types of information. For example, the storage unit 13a stores a set temperature and the like of the stage 10. Further, the storage unit 13a stores an offset amount from the set temperature of each of the second to fourth regions Z2 to Z4 of the wafer mounting surface 110a from the set temperature of the stage 10. For the offset amount, for example, a value (+1° C. or the like) other than zero is set only for the third region Z3, which is close to the port 132 and is easier to cool than other regions, and zero is set for the second region Z2 and the fourth region Z4.

The temperature acquisition unit 13b acquires the temperature of the stage 10. Specifically, the temperature acquisition unit 13b acquires the temperatures of the first to fourth regions Z1 to Z4 of the wafer mounting surface 110a of the stage 10. More specifically, the temperature acquisition unit 13b measures resistances of resistance heating elements of the heaters $121_1$ to $121_4$ corresponding to the first to fourth regions Z1 to Z4. Since the electrical resistance of the resistance heating element changes depending on the temperature as described above, the temperature acquisition unit 13b calculates the temperatures of the resistance heating elements of the heaters $121_1$ to $121_4$ based on the measurement results of the resistances of the resistance heating elements of the heaters $121_1$ to $121_4$. Then, the temperature acquisition unit 13b sets the temperature of the heater $121_1$ as the temperature of the first region Z1 of the wafer mounting surface 110a and similarly sets the temperatures of the heater $121_2$ to $121_4$ as the temperatures of the second to fourth regions Z2 to Z4 of the wafer mounting surface 110a.

The heating control unit 13c controls the heating unit 120 based on the acquisition result of the temperature acquisition unit 13b.

As illustrated in FIG. 6, the heating control unit 13c has first to fourth region control units 201 to 204.

The first region control unit 201 controls the heater $121_1$ of the first region Z1, which is the centermost region of the wafer mounting surface 110a. Specifically, the first region control unit 201 performs a feedback control (for example, PID control) on the first region Z1 to adjust an operation amount of the heater $121_1$ provided in the first region Z1 so that the temperature of the first region Z1 becomes the set temperature of the stage 10 which is a control target temperature. Therefore, the first region control unit 201 includes a deviation calculator 201a, which calculates a deviation of the temperature of the first region Z1 acquired by the temperature acquisition unit 13b with respect to the set temperature, and a controller 201b which outputs the operation amount of the heater $121_1$ which performs a control calculation based on the deviation. The controller 201b calculates the operation amount of the heater $121_1$ by, for example, the PID calculation of the deviation.

The second region control unit 202 controls the heater $121_2$ provided in the second region Z2 located outside of the first region Z1 of the wafer mounting surface 110a in a diametral direction. Specifically, the second region control unit 202 performs the feedback control (for example, PID control) on the second region Z2 to adjust an operation amount of the heater $121_2$ provided in the second region Z2 so that a temperature difference between a temperature of the second region Z2 and the temperature of the first region Z1 becomes an offset amount for the second region Z2 stored in the storage unit 13a. Therefore, the second region control unit 202 includes a deviation calculator 202a which calculates a deviation between the temperature difference between the second region Z2 and the first region Z1 and the offset amount from the temperatures of the first region Z1 and the second region Z2 acquired by the temperature acquisition unit 13b and the offset amount stored in the storage unit 13a, and a controller 202b which outputs the operation amount of the heater $121_2$ which performs a control calculation based on the deviation. The controller 202b calculates the operation amount of the heater $121_2$ by, for example, the PID calculation of the deviation.

The third and fourth region control units 203 and 204 control the heaters $121_3$ and $121_4$ provided in the third and fourth regions Z3 and Z4. Since the configurations of the third and fourth region control units 203 and 204 are the same as the configurations of the second region control unit 202, descriptions thereof will be omitted.

In other words, the heating control unit 13c performs the heating control on the first region Z1 as a master area and the second to fourth regions Z2 to Z4 as slave areas among the first region Z1 and the second to fourth regions Z2 to Z4 adjacent in the diametral direction. Then, the heating control unit 13c controls the heater $121_1$ with the set temperature of the stage 10 as the control target temperature for the master area and controls the heaters $121_2$ to $121_4$ for the slave areas so that the temperature differences between the slave areas and the master area become the offset amount set with respect to the slave area.

Return to the descriptions of FIG. 5.

The cooling control unit 13d controls the cooling unit 130. Specifically, the cooling control unit 13d controls the temperature and flow rate of the refrigerant flowing through the flow path 131 of the cooling unit 130 based on the set temperature of the stage 10.

In the present embodiment, under the control of the heating control unit 13c and the cooling control unit 13d, each region of the wafer mounting surface 100a is heated by the heating unit 120 while the entire wafer mounting surface 110a is cooled by the cooling unit 130. As a result, the temperature of the wafer mounting surface 110a becomes uniform in the surface, and even when the electronic device suddenly generates heat during the electrical characteristic test, the temperature of the wafer mounting surface 110a is maintained at a desired temperature, and thus, the temperatures of the wafer W and the electronic device are also maintained at desired temperatures.

Next, an example of a test process using the test device 1 will be described.

In the test process, first, the wafer W is taken out of the FOUP of the loader 3, transported to the stage 10, and mounted on the stage 10. Next, the stage 10 is moved, and the probes 11a provided above the stage 10 come into contact with the electrodes of the electronic device to be tested on the wafer W.

Then, a signal for test is input to the probe 11a. Therefore, the electrical characteristic test of the electronic device is started. When the electrical characteristic test is completed, the stage 10 is moved, and the same test process is performed on a subsequent electronic device to be tested in the wafer W.

After that, the test process is repeated until the electrical characteristic test for all electronic devices is completed.

During the above-described electrical characteristic test, the temperature of the electronic device is required to be a desired temperature. Therefore, during the electrical characteristic test and before and after the electrical characteristic test, the heating unit 120 and the cooling unit 130 are controlled so that the temperature of the wafer mounting surface 110a of the stage 10 becomes a desired temperature, and thus, the temperature of the wafer W, that is, the temperature of the electronic device, becomes a desired temperature. Specifically, for example, during the electrical characteristic test and before and after the electrical characteristic test, the temperature acquisition unit 13b constantly acquires the temperatures of the first to fourth regions Z1 to Z4 of the wafer mounting surface 110a. Then, feedback control is performed by the heating control unit 13c based on the acquired first to fourth regions Z1 to Z4 and the set temperature of the stage 10. Further, the cooling unit 130 is controlled by the cooling control unit 13d based on the set temperature of the stage 10.

As described above, in the present embodiment, the wafer mounting surface 110a of the stage 10 is divided into two regions in the diametral direction. Then, for the first region Z1 at the center of the two regions on the wafer mounting surface 110a, the feedback control is performed to adjust the operation amount of the heater $121_1$ provided in the first region Z1 so that the temperature of the first region Z1 becomes the set temperature. Further, for the second to fourth regions Z2 to Z4 which are peripheral regions in the wafer mounting surface 110a, the feedback control is performed to adjust the operation amounts of the heaters $121_2$ to $121_4$ of the regions Z2 to Z4 so that the temperature difference between the regions Z2 to Z4 and the first region Z1 becomes the offset amount set in each of the regions Z2 to Z4.

In the above-described conventional individualized feedback control of which the control method is different from that of the control of the present embodiment, as described above, in the transitional period when the electrical characteristic test is started and the electronic device starts to generate heat, in some cases, only the central region of the substrate mounting surface does not fall within the desired range. The reason is as follows. Hereinafter, the first region Z1 located at the center of the wafer W may be referred to as a center region Z1, and the second to fourth regions Z2 to Z4 located at the periphery of the wafer W may be referred to as peripheral regions Z2 to Z4 or the like.

In all of the central region Z1 and the peripheral regions Z2 to Z4, there is heat transfer between an atmosphere on an upper surface and a material of a lower surface. Meanwhile, for heat transfer to a side, in the peripheral regions Z2 to Z4, since the temperature difference with the outer atmosphere is basically larger than the temperature difference with the inner central region Z1, the heat transfer to the outer atmosphere becomes dominant. On the other hand, in the central region Z1, there is only heat transfer to the outer peripheral regions Z2 to Z4. Moreover, the heat transfer from the central region Z1 to the outer peripheral regions Z2 to Z4 is smaller than the heat transfer from the outer peripheral regions Z2 to Z4 to the outer atmosphere. Therefore, since the heat transfer in a lateral direction is smaller in the central region Z1 than in the peripheral regions Z2 to Z4, the central region Z1 tends to have a larger heat dissipation time constant than that of the peripheral regions Z2 to Z4. As a result, during a transient response, heat transfer from the peripheral regions Z2 to Z4 interferes with the central region Z1 and causes overshoot and undershoot.

Therefore, in order to solve this problem, it is important to control the heat transfer between the central region Z1 and the peripheral regions Z2 to Z4 as much as possible. When the heat transfer is zero, there will be no interference.

Meanwhile, in the above-described conventional individualized feedback control, since the interference of each region is not taken into consideration, the overshoot and undershoot occur easily, and particularly, in the region having a slow control mode such as the central region Z1, the overshoot or the like occurs prominently. As a result, it takes time for the central region Z1 to stabilize at the set temperature, and the amount of deviation from the set temperature may not be within the desired range.

More specifically, for example, when the set temperature is higher than room temperature and an amount of heat generated from the electronic device during the electrical characteristic test is large, in the above-described conventional individualized feedback control, the amount of the heat transfer from the central region to the outside in a horizontal direction is small since the central region Z1 is surrounded by the peripheral regions Z2 to Z4 having substantially the same temperature with that of the central region Z1 at the outside thereof in a plan view. On the other hand, in the peripheral regions Z2 to Z4, the outer side in a horizontal direction is the ambient atmosphere such as the atmosphere and has room temperature. Therefore, is the amount of the heat transfer from the peripheral regions Z2 to Z4 to the outside in the horizontal direction is larger than that from the central region Z1. Therefore, cooling capacity of the peripheral regions Z2 to Z4 is higher than that of the central region Z1. This means that the central part retains a mode with a slower time constant than the peripheral part.

As described above, since the cooling capacity of the peripheral regions Z2 to Z4 is higher than that of the central region Z1, in the above-described conventional individualized feedback control, the peripheral regions Z2 to Z4 radiate heat generated from the electronic device to outer portions in a plan view, and thus, the peripheral regions Z2 to Z4 enter a steady state earlier than the central region Z1. On the other hand, the central region Z1 takes longer to stabilize at the set temperature than the peripheral regions Z2 to Z4, and thus, the amount of deviation from the set temperature may not be within the desired range.

As described above, an example of the transitional period is the period when the electrical characteristic test starts and the electronic device begins to generate heat. During the transitional period, both the peripheral regions Z2 to Z4 and the central region Z1 are hotter than the set temperature, but the peripheral regions Z2 to Z4 have a higher cooling capacity. As the heater included in the peripheral regions consumes a higher watt density in the steady state, when the power of the heater is reduced, the temperatures of the peripheral regions Z2 to Z4 drop to the set temperature earlier than the temperature of the central region Z1. Further, during the transitional period, the temperature of the central region Z1 is reduced to the set temperature by reducing the power of the heater in the same manner as the peripheral regions Z2 to Z4. However, since there are peripheral regions Z2 to Z4 that have reached the set temperature earlier, heat cannot be sufficiently radiated. Therefore, the amount of deviation (the amount of overshoot during the transitional period) from the set temperature of the central region Z1 becomes large, and it may deviate from the desired range.

On the other hand, in the present embodiment, as described above, the feedback control for the peripheral regions Z2 to Z4 in the wafer mounting surface 110a is performed so that the temperature difference between the peripheral regions Z2 to Z4 and the central region Z1 is the offset amount. In other words, the temperature control of the peripheral regions Z2 to Z4 is performed based on the temperature control of the central region Z1, and the heat transfer from the peripheral portion is minimized according to control characteristics having the slowest mode. Therefore, during the period, the amount of deviation from the set temperature of the central region Z1 does not fall outside the desired range. Therefore, even during the period, the amount of deviation from the set values of the temperatures of the first to fourth regions Z1 to Z4 can be controlled to be within a desired range. In addition, according to the present embodiment, it is possible to shorten the time for the temperatures of the first to fourth regions Z1 to Z4 to be stabilized in the steady state, which is the set temperature.

Even in other transitional periods (for example, a period immediately after the set temperature is changed to a low value), by performing the control as in the present embodiment, as described above, the amount of deviation from the set values of the temperatures of the first to fourth regions Z1 to Z4 can be controlled to be within a desired range.

As a control method different from the present embodiment, there is a control method using a model in which mutual interference is constructed based on an equation of state in a modern control theory. However, since the model of this method is mostly constructed by a linear model, it may become unusable when the state quantity, such as temperature, is changed. Moreover, it is difficult to build a model accurately.

On the other hand, in the present embodiment, it is possible to control the second to fourth regions Z2 to Z4 so that a flux of heat flowing into the first region Z1 becomes zero while independently controlling the central first region Z1 in which the fullest of heat is retained and the overshoot or undershoot easily occurs. With this simple control structure, thermal interference between the central first region Z1 and the second to fourth regions Z2 to Z4 can be minimized. Therefore, even with feedback control of a simple control method using PID control, P control, PI control, or PD control, the amount of deviation from the set temperature of the first region Z1 can be controlled to be within a desired range.

Further, in the present embodiment, the heating unit 120 is provided at a position closer to the wafer mounting surface 110a than the cooling unit 130, that is, the cooling unit 130 is not provided between the heating unit 120 and the wafer mounting surface 110a. Therefore, since the heat capacity with respect to the heating unit 120 is small, the heating by the heating unit 120 can be performed with good responsiveness.

In the above description, the heating unit 120 is provided below the top plate 110 via the electromagnetic shield layer or the like, but the heating unit may be provided in the top plate. In this case, when a highly conductive material such as tungsten is used as the heating element of the heating unit, a base material of the top plate is formed of a material having high electrical insulation and thermal conductivity such as aluminum nitride.

Further, in the present embodiment, the wafer mounting surface 110a is divided into a plurality of regions, and for each region, the wafer mounting surface 110a is heated from the position closer to the cooling unit 130 with the heater provided in the region according to the temperature of the region. Therefore, the heating of each region by the heating unit 120 having good responsiveness corresponds to a local temperature change of the wafer mounting surface 110a. Further, by absorbing the heat of the entire wafer mounting surface 110a by the cooling unit 130 in addition to the above-described heating, it is possible to cope with the local heat generation during the electrical characteristic test of the electronic device having a high heat generation density.

In the related art, unlike the present embodiment, only one of cooling and heating is performed, and the top plate of the stage is thickened to increase the heat capacity. Then, when the electronic device generates heat, the heat is absorbed with the heat capacity of the top plate. However, in recent years, the heat generation density of electronic devices has become high, and thus, it is not possible to maintain the electronic device having a high heat generation density at a desired temperature by the above-described conventional method.

On the other hand, according to the present embodiment, as described above, even in the electronic device having a high heat generation density, it is possible to cope with local heat generation at the time of electrical characteristic test and maintain the temperature at a desired temperature.

Furthermore, in the present embodiment, the temperatures of the first to fourth regions Z1 to Z4 in which the heaters $121_1$ to $121_4$ are provided are acquired based on the electric resistance of the heaters $121_1$ to $121_4$ of the heating unit 120. Therefore, since a temperature sensor is not used to acquire the temperature of the first to fourth regions Z1 to Z4, the temperature control for each divided region of the wafer mounting surface 110a can be easily performed at low cost.

Moreover, unlike the above description, a temperature sensor may be provided on the stage 10 to measure the temperatures of the first to fourth regions Z1 to Z4.

In the above descriptions, the electrical characteristic test is performed on each electronic device, but when the heat generation density of the electronic device is small, the electrical characteristic test may be performed on a plurality of electronic devices at once.

Further, in the above, the wafer mounting surface is divided into two regions in the diametral direction but may be divided into three or more regions in the diametral direction.

In this case, the control unit 13 performs the same control as for the first region Z1 for the centermost region among the three or more regions on the wafer mounting surface 110a.

Further, in this case, the control unit 13 performs the following control on the region outside the centermost region among the three or more regions on the wafer mounting surface 110a. That is, the control unit 13 performs the feedback control which adjusts the operation amount of the heater provided in the outer region so that the temperature difference between the outer region and the region adjacent to the inner side in the diametral direction of the outer region becomes a preset value.

Example

Figure 7:
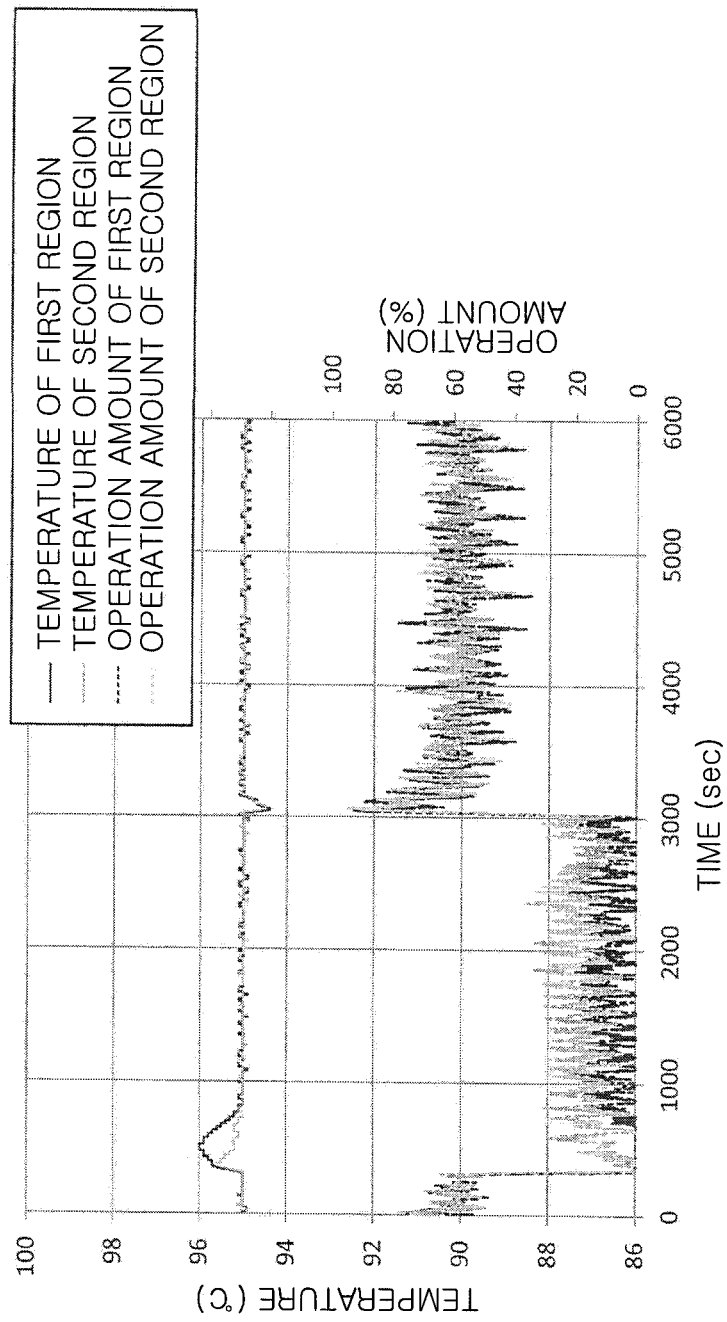
FIG. 7 is a diagram illustrating a comparative example of results of simulating temperatures of a centermost region and each region, which is in front or the rear of the centermost region, of a wafer mounting surface when an electronic device to be tested generates heat.
Figure 8:
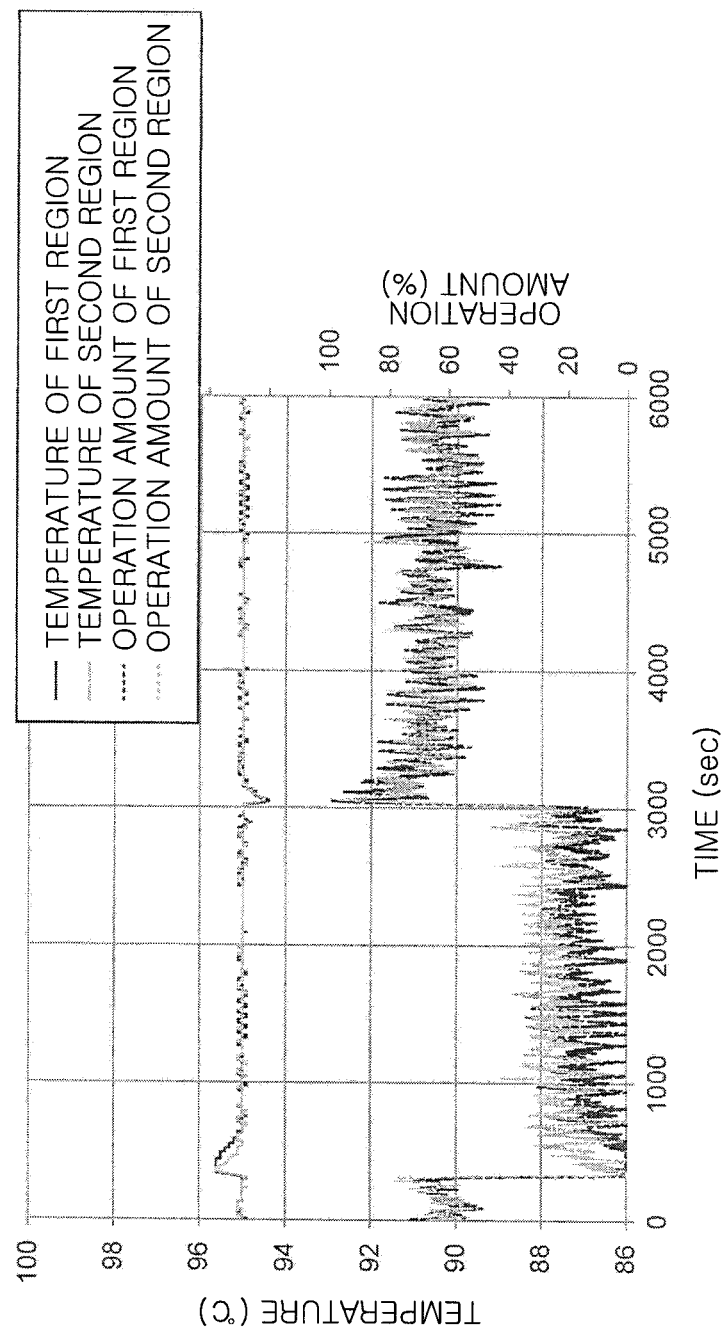
FIG. 8 is a diagram illustrating an example of results of simulating temperatures of a centermost region and each region, which is in front or the rear of the centermost region, of a wafer mounting surface when an electronic device to be tested generates heat.

FIGS. 7 and 8 are diagrams illustrating the results of simulating the temperatures of a centermost region and each region, which is in front or the rear of the centermost region, of the wafer mounting surface 110a when the electronic device to be tested generates heat, FIG. 7 illustrates a comparative example, and FIG. 8 illustrates an example. In the drawings, a horizontal axis represents time, a vertical axis on a left side represents the temperature of the wafer mounting surface 110a, and a vertical axis on a right side represents the operation amount of each heater. In each drawing, the temperatures of the third region Z3 and the fourth region Z4 and the operation amounts of the heaters $121_3$ and $121_4$ with respect to the third and fourth regions Z3 and Z4 are the same as those of the second region Z2, and thus the descriptions thereof are omitted.

The comparative example is the simulation result when the test device for comparison is used. The test device for comparison is different from the test device of the present embodiment only in the method of controlling the temperature of each of the second to fourth regions Z2 to Z4 of the wafer mounting surface 110a. Specifically, in the test device for comparison, the temperatures of the second to fourth regions Z2 to Z4 were controlled in the same manner as that of the first region Z1, and the feedback control was performed based on the deviation of the temperature of each of the second to fourth regions Z2 to Z4 with respect to the set temperature. In other words, in the test device for comparison, the above-described conventional individualized feedback control was performed.

The example is a simulation result when the test device 1 of the present embodiment is used.

In the simulation, it was assumed that the electronic device generated heat for about 2700 seconds after about 300 seconds had elapsed. Moreover, the temperature of the refrigerant was 20° C., a material of the top plate of the stage 10 was stainless steel, and the set temperature of the wafer mounting surface was 95° C. In addition, a calorific value of the electronic device was 1000 W, a maximum output of the heater $121_1$ of the first region Z1 was 1000 W, the maximum output of the heater $121_2$ to $121_4$ of the second to fourth regions Z2 to Z4 was 1000 W, and a flow rate of the refrigerant was constant. Further, the PID control was performed as the feedback control.

As illustrated in FIG. 7, in the comparative example in which the above-described ordinary individual feedback control was performed, a maximum overshoot amount of the second region Z2 of the peripheral portion of the wafer mounting surface 110a with respect to the set temperature was about 0.6° C. Meanwhile, a maximum overshoot amount of the first region Z1 at the center of the wafer mounting surface 110a during the transition period was a maximum of 1° C., which was much larger than that of the second region Z2.

On the other hand, in the example, as illustrated in FIG. 8, the overshoot amount during the transitional period was about 0.6° C. in both the second region Z2 and the first region Z1 and was within a desired range with no difference between the two regions. In addition, the time to stabilize at the set temperature of 95° C. was earlier than that of the comparative example.

The embodiments disclosed here should be considered to be exemplary in all respects and not restrictive. The above embodiments may be omitted, replaced, or modified in various forms without departing from a scope of appended claims and the gist thereof.

The following configurations also belong to a technical scope of the present disclosure.

(1) In a method of performing temperature control of a mounting base on which a substrate is to be mounted, the method including: dividing a substrate mounting surface of the mounting base into a plurality of regions in a diametral direction and providing a heater for each of the plurality of regions; performing feedback control that adjusts an operation amount of the heater in a centermost region among the plurality of regions of the substrate mounting surface so that a temperature of the centermost region reaches a set temperature; and performing feedback control that adjusts the operation amount of the heater in an outer side region that is further to the outer side region than the centermost region among the plurality of regions of the substrate mounting surface so that a temperature difference between the outer side region and the region that is adjacent to the outer side region inward in the diametral direction becomes a preset value.

According to (1), when the substrate mounting surface of the mounting base is divided into the plurality of regions in the diametral direction and the heater is provided in each region to control a temperature of the substrate mounting surface, even in a transitional period, it is possible to keep an amount of deviation from a set value of the temperature of each region within a desired range.

(2) In the method of (1), the method includes cooling the substrate mounting surface of the mounting base using a cooling unit and, at the same time, heating the substrate mounting surface using a heater disposed at a position closer to the substrate mounting surface than the cooling unit.

According to (2), even when the mounted substrate suddenly generates heat at a high heat generation density, the temperature of the wafer mounting surface can be maintained at a desired temperature, and thus, the temperature of the substrate can be also maintained at desired temperatures.

(3) In the method of (1) or (2), the method includes measuring an electric resistance of a heating element included in the heater and acquiring a temperature of a region of the substrate mounting surface in which the heater is provided based on a measurement result of the electric resistance.

According to (3), a temperature control for each divided region of the substrate mounting surface can be easily performed at low cost.

(4) In a test device for testing a substrate to be tested, the test device includes a mounting base on which the substrate to be tested is mounted, and a control unit, in which a substrate mounting surface of the mounting base is divided into a plurality of regions in a diametral direction and a heater is provided for each of the plurality of regions, and the control unit performs feedback control that adjusts an operation amount of the heater in a centermost region among the plurality of regions of the substrate mounting surface so that a temperature of the centermost region reaches a set temperature, and performs feedback control that adjusts the operation amount of the heater in an outer side region outside the centermost region among the plurality of regions of the substrate mounting surface so that a temperature difference between the outer side region and a region that is adjacent to the outer side region inward in the diametral direction becomes a preset value.

(5) In the test device of (4), the mounting base includes a cooling unit configured to cool the substrate mounting surface, and the heater is provided at a position closer to the substrate mounting surface than the cooling unit.

According to (5), since heat capacity of the portion heated by the heater is small, heating by the heater can be performed with good responsiveness.

(6) In the test device of (4) or (5), the control unit acquires a temperature of a region of the substrate mounting surface in which the heater is provided based on a measurement result of an electric resistance of a heating element included in the heater.

(7) In a mounting base on which a substrate is mounted, the mounting base, in the order closest to a substrate mounting surface, includes a heating layer having a heater in which a heating element that generates heat when a current flows is provided, and a cooling layer in which a flow path for refrigerant is formed, in which the substrate mounting surface is divided into a plurality of regions, and the heating layer includes the heater for each of the plurality of regions of the substrate mounting surface.

DESCRIPTION OF REFERENCE NUMERALS

1: test device
10: stage
13: control unit
110a: wafer mounting surface
$121_1$, $121_2$, $121_3$, $121_4$: heater
W: wafer
Z1: first region
Z2: second region
Z3: third region
Z4: fourth region

The invention claimed is:

1. A method of performing temperature control on a mounting base on which a substrate is to be mounted, the method comprising:
   dividing a substrate mounting surface of the mounting base into a plurality of regions in a diametral direction and providing a heater for each of the plurality of regions;
   performing feedback control to adjust an operation amount of the heater in a centermost region among the plurality of regions of the substrate mounting surface so as to make a temperature of the centermost region to reach a set temperature; and
   performing feedback control to adjust the operation amount of the heater in an outer side region outside the centermost region among the plurality of regions of the substrate mounting surface so as to make a temperature difference between the outer side region and a region that is adjacent to the outer side region inward in the diametral direction to be a preset value.

2. The method of claim 1, comprising cooling the substrate mounting surface of the mounting base by using a cooling unit and, at the same time, heating the substrate mounting surface by using the heater disposed at a position closer to the substrate mounting surface than the cooling unit.

3. The method of claim 1, comprising measuring an electric resistance of a heating element included in the heater and acquiring a temperature of the region of the substrate mounting surface in which the heater is provided based on a measurement result of the electric resistance.

4. A test device for testing a substrate to be tested, the test device comprising:
   a mounting base on which the substrate to be tested is mounted; and
   a control unit,
   wherein a substrate mounting surface of the mounting base is divided into a plurality of regions in a diametral direction and a heater is provided for each of the plurality of regions, and
   the control unit performs feedback control that adjusts an operation amount of the heater in a centermost region among the plurality of regions of the substrate mounting surface so as to make a temperature of the centermost region to reach a set temperature, and
   performs feedback control that adjusts the operation amount of the heater in an outer side region outside the centermost region among the plurality of regions of the substrate mounting surface so as to make a temperature difference between the outer side region and a region that is adjacent to the outer side region inward in the diametral direction to be a preset value.

5. The test device of claim 4, wherein the mounting base includes a cooling unit configured to cool the substrate mounting surface, and
   wherein the heater is provided at a position closer to the substrate mounting surface than the cooling unit.

6. The test device of claim 4, wherein the control unit acquires a temperature of the region of the substrate mounting surface in which the heater is provided based on a measurement result of an electric resistance of a heating element included in the heater.

* * * * *